(12) United States Patent
Rabbitt

(10) Patent No.: US 10,804,651 B1
(45) Date of Patent: Oct. 13, 2020

(54) ELECTROMAGNETIC INTERFERENCE SHIELDING FOR CIRCUIT BOARD MOUNTED CONNECTORS

(71) Applicant: Lockheed Martin Corporation, Bethesda, MD (US)

(72) Inventor: Jameson Rabbitt, Clermont, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 16/185,084

(22) Filed: Nov. 9, 2018

Related U.S. Application Data

(60) Provisional application No. 62/583,587, filed on Nov. 9, 2017.

(51) Int. Cl.
*H01R 13/6581* (2011.01)
*H01R 13/6594* (2011.01)
*H05K 9/00* (2006.01)

(52) U.S. Cl.
CPC ..... *H01R 13/6581* (2013.01); *H01R 13/6594* (2013.01); *H05K 9/005* (2013.01); *H05K 9/0049* (2013.01); *H05K 9/0052* (2013.01)

(58) Field of Classification Search
CPC ............ H01R 13/6581; H01R 13/6594; H01R 12/716; H05K 9/0049; H05K 9/005; H05K 9/0052
See application file for complete search history.

(56) References Cited

U.S. PATENT DOCUMENTS

| 6,005,186 | A  | * | 12/1999 | Bachman  | ........... | H01R 13/6582 |
|---|---|---|---|---|---|---|
|   |   |   |   |   |   | 174/377 |
| 6,612,868 | B2 | * | 9/2003  | Hwang    | ................ | H05K 9/0058 |
|   |   |   |   |   |   | 439/607.54 |
| 6,878,872 | B2 | * | 4/2005  | Lloyd    | .................. | G02B 6/4277 |
|   |   |   |   |   |   | 174/384 |
| 7,074,085 | B2 | * | 7/2006  | Chen     | ..................... | H01R 13/658 |
|   |   |   |   |   |   | 439/607.36 |
| 8,724,343 | B2 | * | 5/2014  | Feldstein | ............. | H05K 9/0058 |
|   |   |   |   |   |   | 361/616 |
| 9,843,148 | B2 | * | 12/2017 | Little    | ..................... | H01R 24/60 |
| 2006/0134982 | A1 | * | 6/2006 | Zarganis | ............ | H01R 13/6595 |
|   |   |   |   |   |   | 439/607.01 |

OTHER PUBLICATIONS

Author Unknown, "790-043P Straight PCT Free-Standing Receptacles," Product Data Sheet, 2011, Glenair, Inc., 4 pages.
Author Unknown, "SMD Grounding Contacts," 2018, Laird, Retrieved Feb. 21, 2019 from https://pm.lairdtech.com/emi-shields-gaskets/smd-grounding-contacts, 1 page.
Author Unknown, "SMT Horizontal Spring Contacts," 2019, Harwin, Retrieved Feb. 21, 2019 from https://www.harwin.com/filter/?level=2&code=EH&tlcode=E, 1 page.
Author Unknown, "SMT Spring Contacts," Harwin, Retrieved Oct. 19, 2017 from https://www.harwin.com/product-highlights/smt-spring-contacts/, Harwin PLC, 3 pages.

* cited by examiner

*Primary Examiner* — Vanessa Girardi
(74) *Attorney, Agent, or Firm* — Withrow & Terranove, PLLC

(57) ABSTRACT

An electromagnetic interference (EMI) shield is disclosed. The EMI shield includes an electrically conductive sleeve configured to surround a connector. The electrically conductive sleeve includes a restriction configured to contact a metal perimeter of the connector and includes a connection member configured to be electrically coupled to a circuit board.

17 Claims, 13 Drawing Sheets

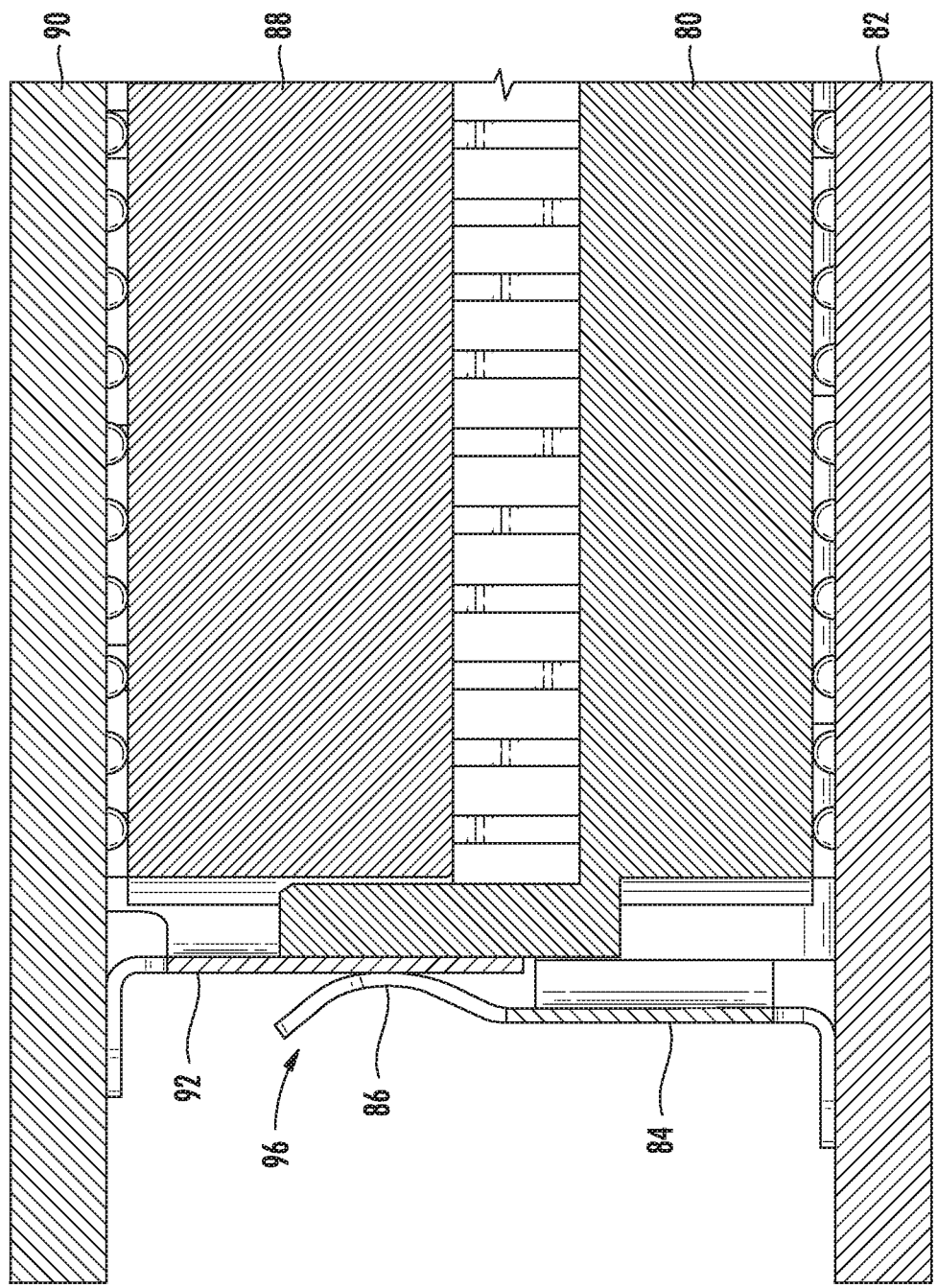

ELECTROMAGNETIC INTERFERENCE SHIELDING FOR CIRCUIT BOARD MOUNTED CONNECTORS

RELATED APPLICATION

This application claims the benefit of U.S. Provisional Application No. 62/583,587, filed on Nov. 9, 2017, entitled "ELECTROMAGNETIC INTERFERENCE SHIELDING FOR CIRCUIT CARD MOUNTED CONNECTORS," the disclosure of which is hereby incorporated herein by reference in its entirety.

TECHNICAL FIELD

The embodiments relate generally to electromagnetic interference (EMI) shielding of connectors, and in particular to EMI shielding for circuit board mounted connectors.

BACKGROUND

Typical connectors mounted to printed wiring boards (PWB), printed circuit boards (PCB), or other types of planar structures, often have gaps where the pin field of interconnections within the connector is exposed. Connections passing through the connector that are otherwise surrounded by conductive material to guard against incoming or radiating emissions are exposed in this region. The exposed pin field may radiate electromagnetic energy emissions which could couple to other connectors or sensitive electronics in the form of electromagnetic interference (EMI). The exposed pin field may also be susceptible to outside emissions from other sources of EMI. EMI can have an adverse effect on the performance of a product. Connectors with bodies made of non-conductive materials that contain the connector interconnections are especially vulnerable to radiating emissions or susceptible to coupling EMI.

Common reasons for such gaps include the use of non-conductive materials in a connector and solder washout in a slot between the circuit board and the connector body. To minimize the effects of EMI, the pin field needs to be surrounded by a conductive shield to which the energy can couple and drain away.

Conventional mechanisms for attempting to solve this problem include the use of conductive adhesives that are tied to a pad on the circuit board through the use of a drain wire/copper braid. Some problems with this method are that the conductive adhesives are time-consuming to install; the final material has varied effectiveness depending on a multitude of variables (e.g., thickness, humidity at install, mixing of material, etc.); and bond wires have a high inductance, which increases impedance at higher frequencies and renders the shielding less effective. Other methods involve the use of a conductive foil tape that ties the connector shell to pads/lands on the circuit board. Again, this method is time consuming to install, and performance degrades over time as the adhesive of the tape is not designed for long-term applications.

SUMMARY

The embodiments relate to an electromagnetic interference (EMI) shield and an EMI shielding system that are easy to install over a connector on a circuit board and are effective at shielding the connector from EMI. Among other advantages, the EMI shield and shielding system are relatively inexpensive to manufacture and greatly reduce the amount of time it takes to shield connectors from EMI. For connectors made with non-conductive materials such as plastic, the shielding system is an inexpensive way to convert an inexpensive connector with no shielding into an electrical interface that can attenuate EMI radiated by the connector as well as protect the connector from EMI radiated by outside sources.

In one embodiment an electromagnetic interference (EMI) shield is provided. The EMI shield includes an electrically conductive sleeve configured to surround a connector. The electrically conductive sleeve includes a restriction configured to contact a metal perimeter of the connector and includes a connection member configured to be electrically coupled to a circuit board.

In another embodiment an EMI shielding system is provided. The EMI shielding system includes a first shield and a second shield. The first shield includes a first electrically conductive sleeve configured to surround a first connector on a first circuit board. The second shield includes a second electrically conductive sleeve configured to surround a second connector on a second circuit board, the second connector being configured to connect to the first connector. One of the first shield and the second shield comprises an inner shield, and another of the first shield and the second shield comprises an outer shield. The inner shield is configured to be at least partially inserted within the outer shield and to contact the outer shield.

Those skilled in the art will appreciate the scope of the disclosure and realize additional aspects thereof after reading the following detailed description of the embodiments in association with the accompanying drawing figures.

BRIEF DESCRIPTION OF THE DRAWINGS

The accompanying drawing figures incorporated in and forming a part of this specification illustrate several aspects of the disclosure and, together with the description, serve to explain the principles of the disclosure.

FIG. 8 illustrates a cross-section of a portion of a male connector, an outer shield, a female connector, and an inner shield, after the male connector and the female connector have been connected to one another according to one embodiment;

DETAILED DESCRIPTION

The embodiments set forth below represent the information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The use herein of ordinals in conjunction with an element is solely for distinguishing what might otherwise be similar or identical labels, such as "first message" and "second message," and does not imply a priority, a type, an importance, or other attribute, unless otherwise stated herein. The terms "about" and "substantially" used herein in conjunction with a numeric value means any value that is within a range of ten percent greater than or ten percent less than the numeric value.

As used herein and in the claims, the articles "a" and "an" in reference to an element refers to "one or more" of the element unless otherwise explicitly specified.

Figure 1:
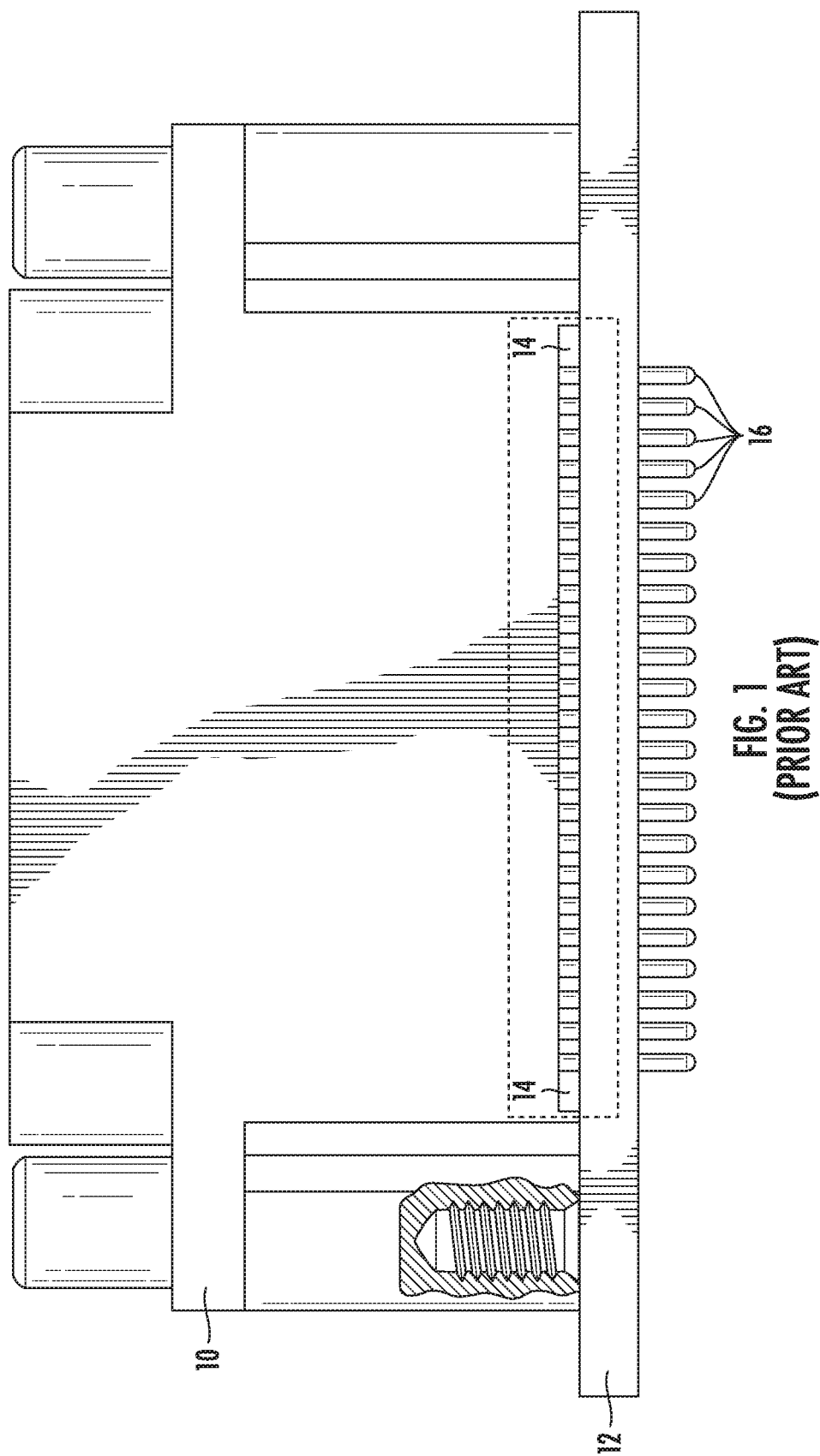
FIG. 1 illustrates a perspective view of a conventional connector attached to a circuit board.

FIG. 1 is a diagram of a conventional connector 10 attached to a circuit board 12. A gap 14 exists between a portion of the connector 10 and the circuit board 12, exposing a portion of pins 16 of the connector 10. The exposed portion of the pins 16 in the gap 14 makes the connector 10 susceptible to electromagnetic interference (EMI) from other circuitry within the vicinity of the connector 10, and facilitates the transmission of EMI from the connector 10 to other circuitry within the vicinity of the connector 10, both of which can have an adverse effect on the performance of a product. The gap 14 can occur, for example, due to solder washout. Moreover, EMI may be a problem even without the gap 14 if the connector 10 utilizes non-conductive materials.

Attempts at mitigating this problem involve the use of conductive adhesives that are tied to a pad on a circuit board through the use of a drain wire/copper braid. Some problems with this method are that the conductive adhesives are time consuming to install; the final material has varied effectiveness depending on a multitude of variables (thickness, humidity at install, mixing of material, etc.); and bond wires have a high inductance, which increases impedance at higher frequencies and renders the shielding less effective. Another mechanism for solving this problem involves the use of conductive foil tape that ties a connector shell to pads/lands on a circuit board. Again, the conductive foil tape is time consuming to install, and performance degrades over time as the adhesive of the tape is not designed for long-term applications.

The embodiments overcome these problems with an electromagnetic interference (EMI) shield and an EMI shielding system that are easy to install over a connector on a circuit board and are effective at shielding the connector from EMI, as well as attenuating radiation of EMI from the connector into the environment. Among other advantages, the EMI shield and EMI shielding system are relatively inexpensive to manufacture and greatly reduce the amount of time it takes to shield connectors from EMI. For connectors made with non-conductive materials such as plastic, the shielding system is an inexpensive way to convert an inexpensive connector with no shielding into an electrical interface that can attenuate EMI radiated by the connector as well as protect the connector from EMI radiated by outside sources.

Figure 2:
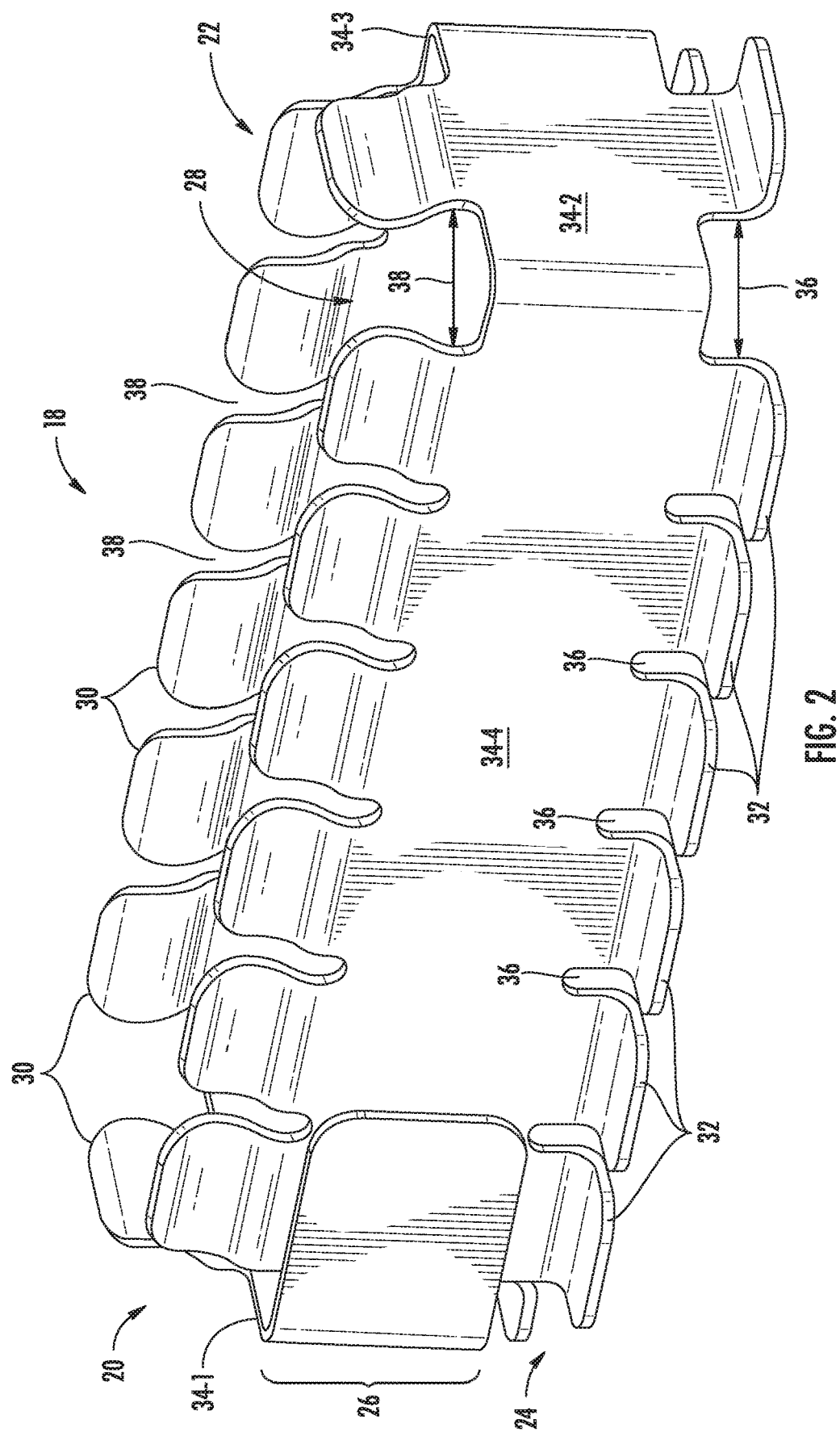
FIG. 2 illustrates a perspective view of an electromagnetic interference (EMI) shield according to one embodiment.
Figure 11:
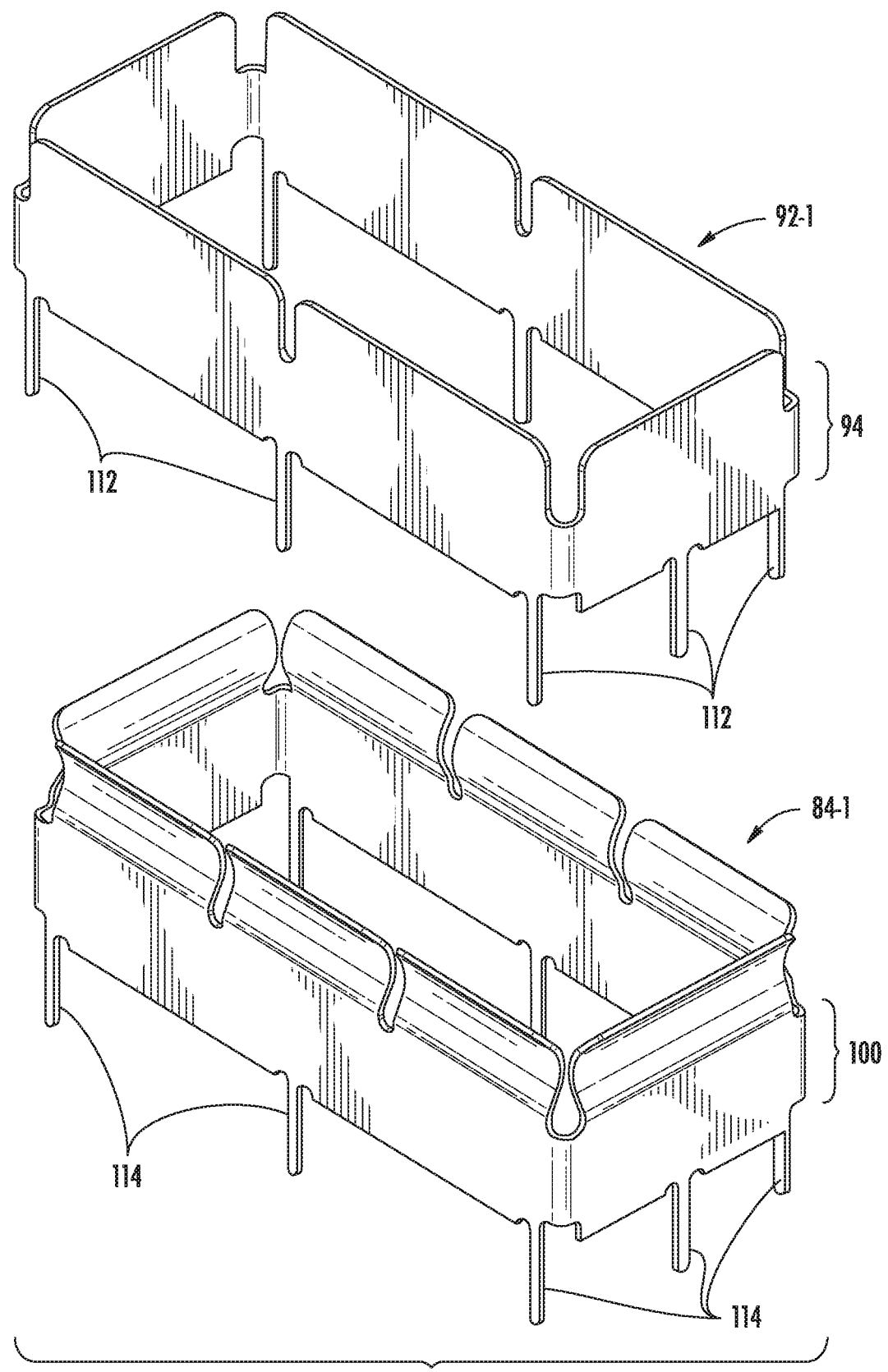
FIG. 11 illustrates a perspective view of an inner shield and an outer shield according to another embodiment.

FIG. 2 illustrates a perspective view of an electromagnetic interference (EMI) shield 18 according to one embodiment. The EMI shield 18 includes an electrically conductive sleeve 20 configured to surround at least a portion of a connector (not illustrated). The electrically conductive sleeve 20 can comprise any conductive material, and in some embodiments comprises metal. The electrically conductive sleeve 20 includes a restriction 22 configured to contact a metal perimeter of the connector. The electrically conductive sleeve 20 also includes a connection member 24 that is configured to be electrically coupled to a circuit board. While the connection member 24 illustrated in FIG. 2 includes a plurality of tabs 32, the embodiments are not limited to such a connection member. For example, in other embodiments, the connection member 24 comprises a plurality of through-hole solder tails, as illustrated in FIG. 11.

The electrically conductive sleeve 20 includes a body 26 that forms an opening 28. In this example, the restriction 22 comprises a plurality of spring fingers 30 arranged about a perimeter of the body 26. The plurality of spring fingers 30 are biased inwardly toward the opening 28, form an inner perimeter that is smaller than an outer perimeter of the connector, and thus, when surrounding the connector, contact the connector. A length of the spring fingers 30 may be designed such that the interior surfaces of the spring fingers 30 contact a metal perimeter of the connector. It will be appreciated that mechanisms other than the spring fingers 30 may be used to contact the metal perimeter of the connector.

In this embodiment the connection member 24 comprises a plurality of individual tabs 32 that extend substantially perpendicularly from the body 26, and are configured to be electrically connected to a ground plane of the circuit board. The individual tabs 32 may be connected to electrical contacts of the circuit board by any suitable attachment mechanism, such as soldering, ultrasonic welding, or the like. In some embodiments, a solder layer is attached to the individual tabs 32 to facilitate attachment of the individual tabs 32 to the circuit board.

In this embodiment, the electrically conductive sleeve 20 has four walls 34-1-34-4. Two end walls 34-1 and 34-2 extend in end wall planes that are parallel to one another, and two side walls 34-3 and 34-4 extend in side wall planes that are parallel to one another and that are perpendicular to the end wall planes.

The electrically conductive sleeve 20 forms a plurality of gaps 36 between the plurality of individual tabs 32. The use of individual tabs 32 helps ensure a consistently distributed electrical contact between the electrically conductive sleeve 20 and the metal perimeter of the connector. The gaps 36 have a width less than a calculated fraction of the smallest wavelength within a predetermined waveband based on system requirements that the electrically conductive sleeve 20 is designed to shield.

Similarly, the spring fingers 30 form a plurality of gaps 38 therebetween, a largest width of any gap 38 being less than a smallest wavelength of the predetermined waveband.

Figure 3:
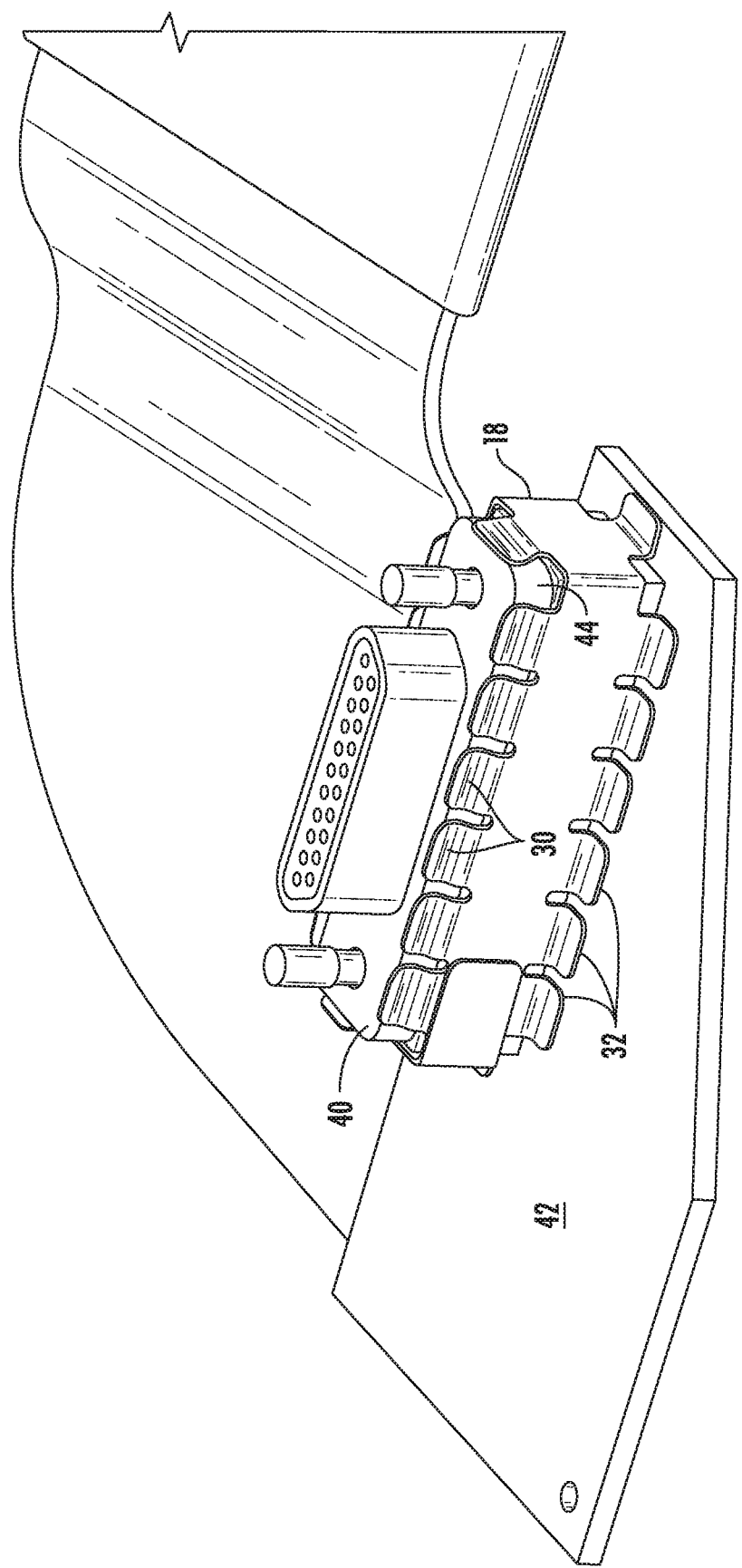
FIG. 3 illustrates a perspective view of the EMI shield illustrated in FIG. 2 used in conjunction with a connector that is attached to a circuit board according to one embodiment.

FIG. 3 illustrates a perspective view of the EMI shield 18 used in conjunction with a connector 40 that is attached to a circuit board 42. Note that the spring fingers 30 contact a metal perimeter 44 of the connector 40. The tabs 32 are attached to electrical contacts of the circuit board 42, and the electrical contacts are electrically tied to a ground place of the circuit board 42.

Figure 4:
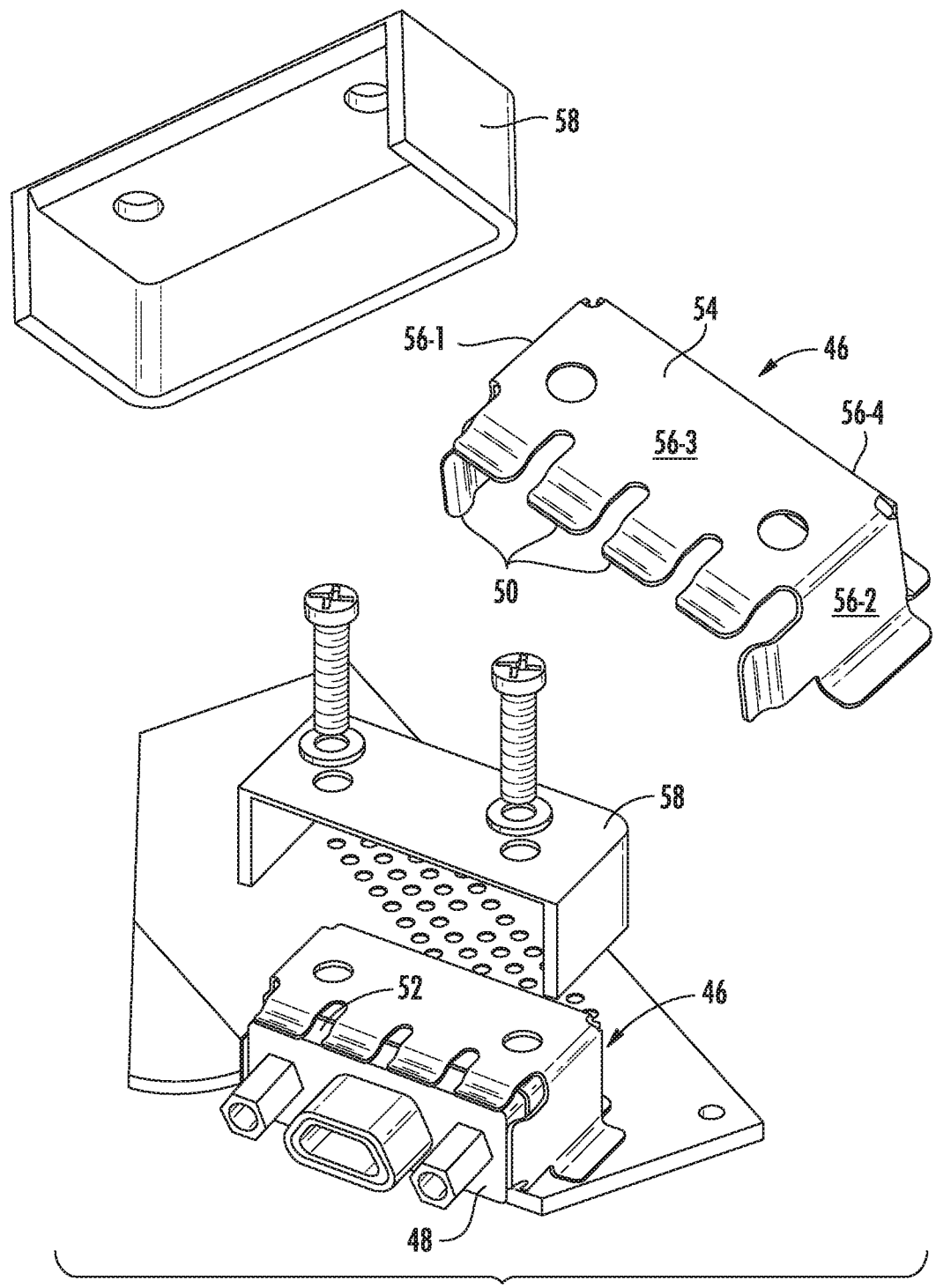
FIG. 4 illustrates a perspective view of a right-angle EMI shield according to one embodiment.

FIG. 4 illustrates a perspective view of a right-angle EMI shield 46 according to one embodiment. The EMI shield 46 is substantially similar to the EMI shield 18 illustrated above, except as otherwise discussed below. In this example, the EMI shield 46 shields a right-angle connector 48 from EMI. The EMI shield 46 includes a plurality of spring fingers 50 that contact a conductive portion 52 of the right-angle connector 48. The EMI shield 46 includes a metal sleeve 54 that has four walls 56-1-56-4. The two end walls 56-1 and 56-2 extend in planes that are parallel to one another. The back wall 56-4 is perpendicular to the two end walls 56-1 and 56-2. The top wall 56-3 is perpendicular to the two end walls 56-1 and 56-2 and to the back wall 56-4, and is connected to the two end walls 56-1 and 56-2 and to the back wall 56-4. In some embodiments, where attachment threads are available, a cover 58 may be placed over the EMI shield 46 to aid consistent spring finger contact to the metal conductive portion 52 of the connector 48.

Figure 5:
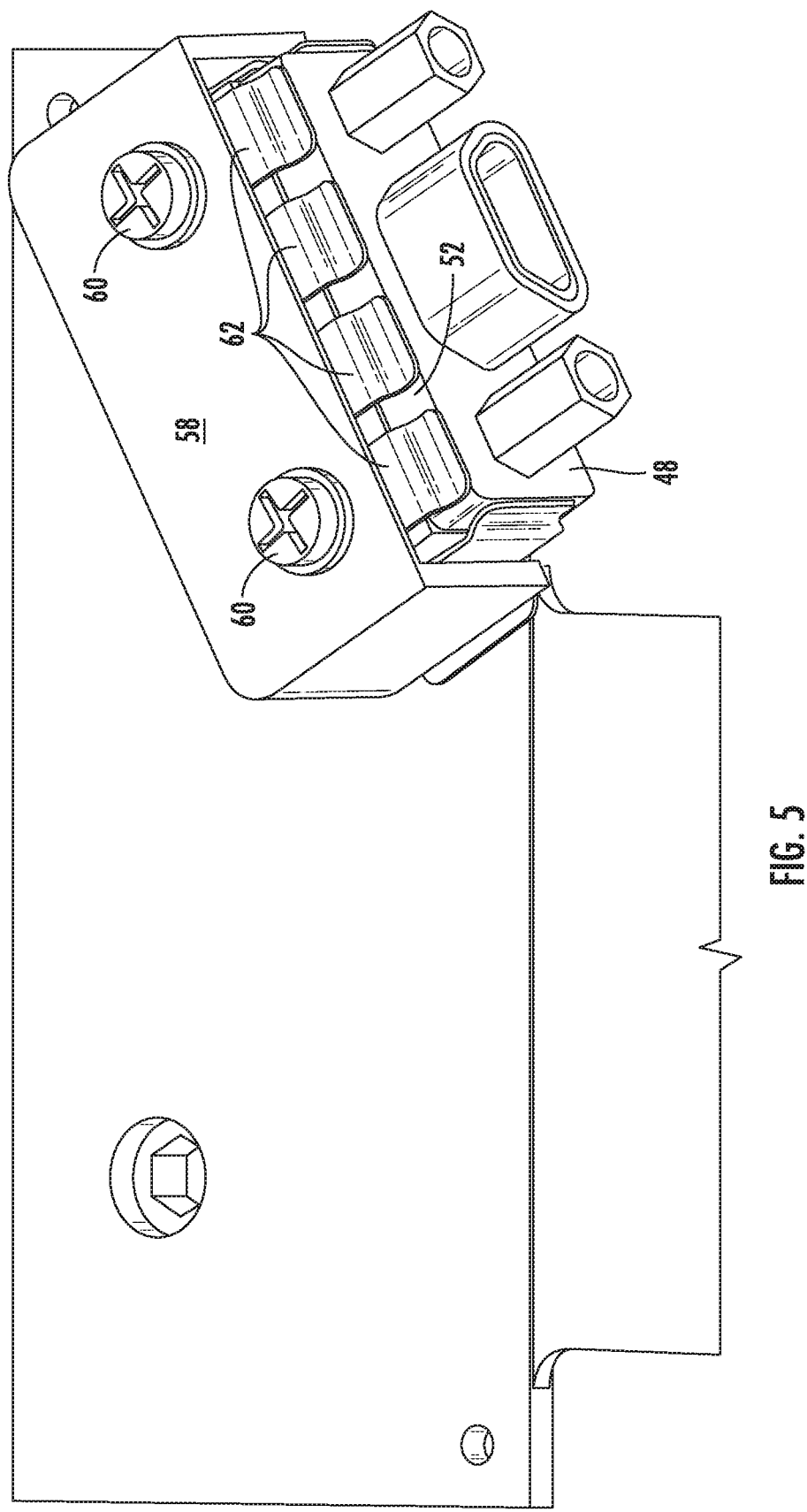
FIG. 5 illustrates a perspective view of a cover affixed to the right-angle EMI shield and connector illustrated in FIG. 4 according to one embodiment.

FIG. 5 illustrates a perspective view of the cover 58 affixed to the EMI shield 46 and connector 48 according to one embodiment. Note that two screws 60 press the cover 58 against the EMI shield 46, ensuring a strong contact between spring fingers 62 of the EMI shield 46 and the metal conductive portion 52 of the connector 48.

Figure 6A:
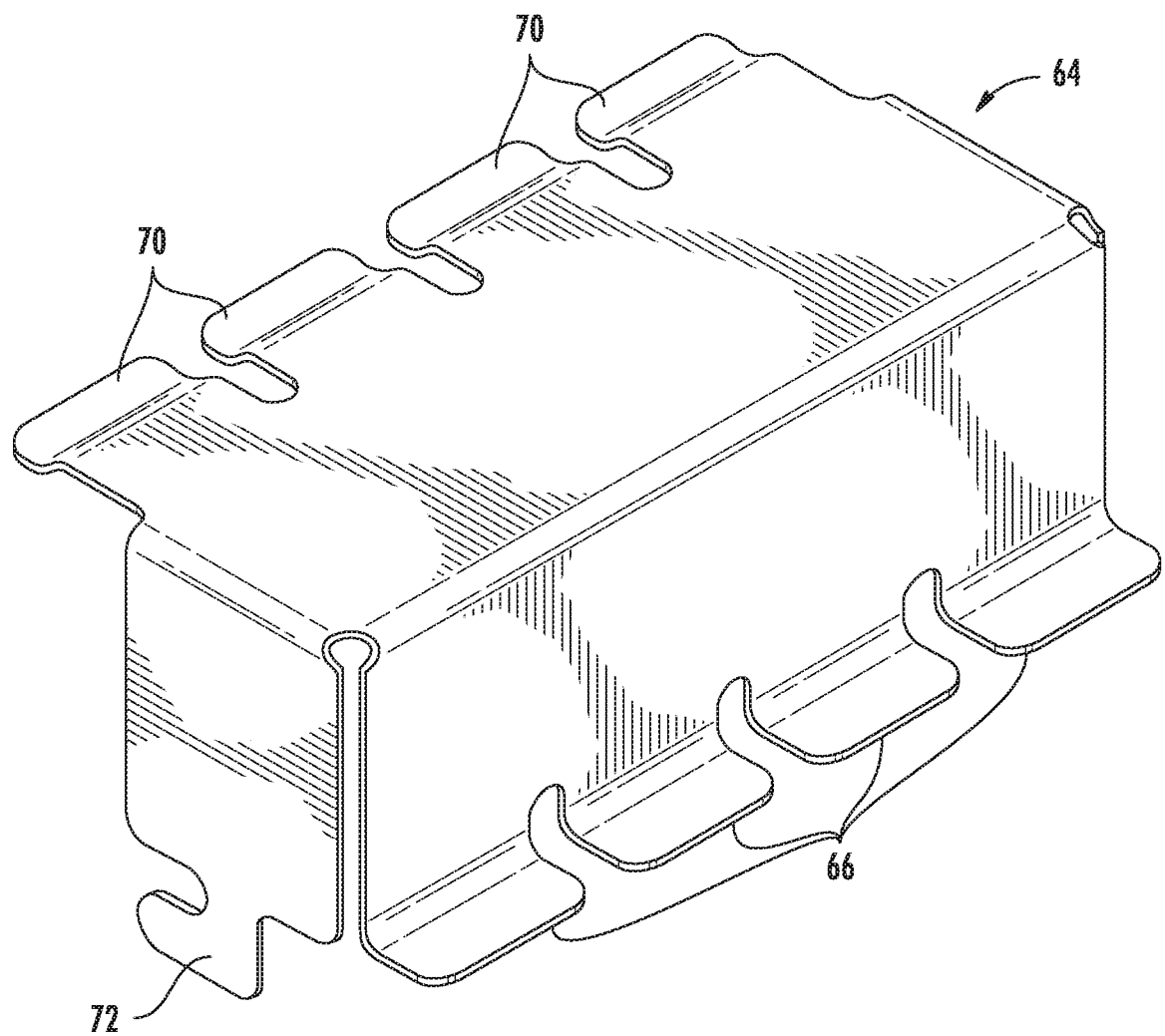
FIGS. 6A-6C illustrate perspective views of a right-angle EMI shield according to another embodiment.
Figure 6B:
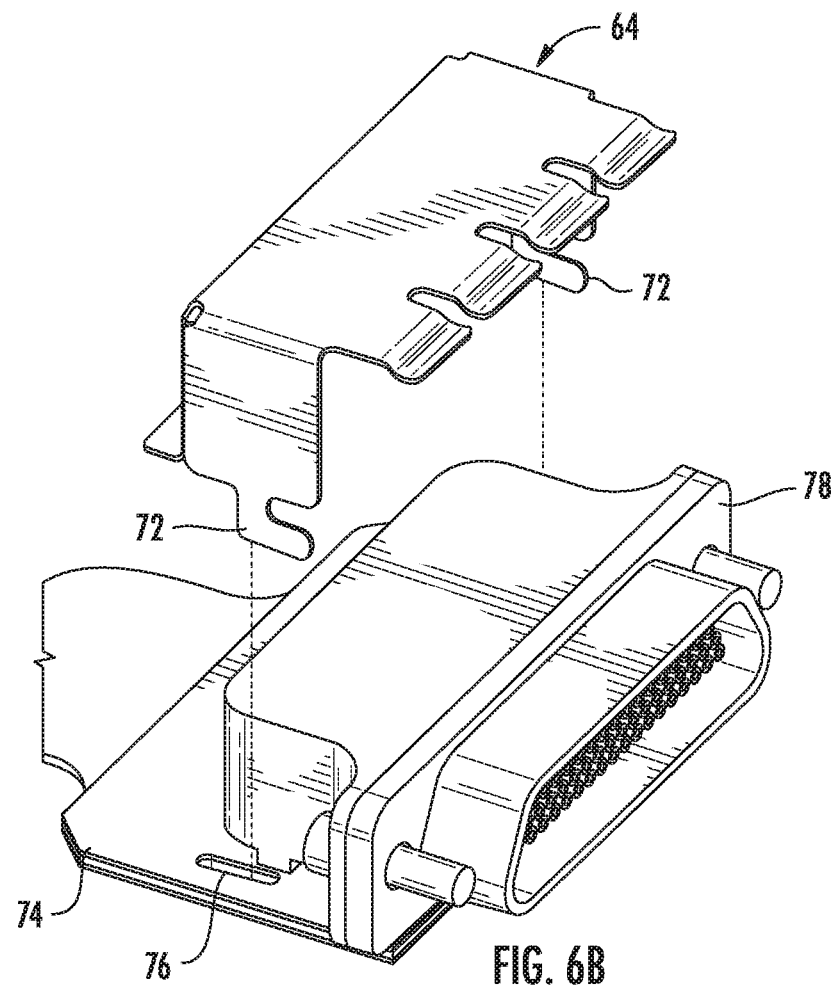
Figure 6C:
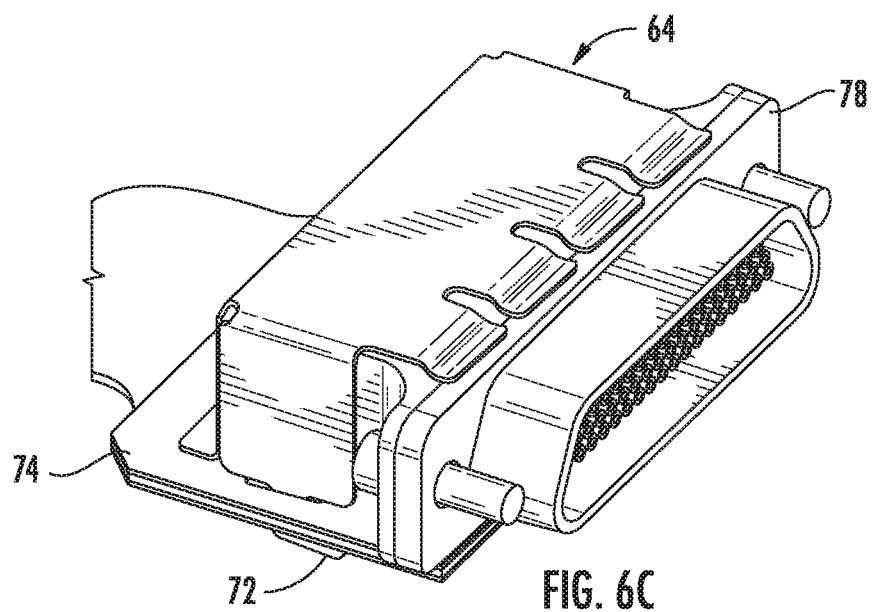

FIGS. 6A-6C illustrate perspective views of a right-angle EMI shield 64 according to another embodiment. Referring first to FIG. 6A, the EMI shield 64 is substantially similar to the EMI shield 18 and the EMI shield 46 illustrated above, except as otherwise discussed below. The EMI shield 64 includes a plurality of tabs 66 suitable for electrical connection to a circuit board, and spring fingers 70 for contacting a metal conductive portion of a connector. The EMI shield 64 also includes two conductive feet 72 that are configured to extend through corresponding slots in a circuit board, where the two conductive feet 72 not only provide a location for electrically bonding the EMI shield 64 to a circuit board, but mechanically create a downward force at the spring fingers 70 to contact a metal conductive portion of a connector. In some embodiments, the two conductive feet 72 may be soldered to a ground plane of the circuit board. FIG. 6B illustrates a circuit board 74 having two slots 76 (only one illustrated) that correspond in distance and size to the two conductive feet 72. The EMI shield 64 is sized to be placed over a connector 78. FIG. 6C illustrates the EMI shield 64 affixed to the circuit board 74, and the two conductive feet 72 extending through the slots 76 where the two conductive feet 72 may be mechanically friction-fitted to stay coupled to the circuit board 74, or may be coupled via solder, ultrasonic welding, or the like, to a ground plane of the circuit board 74. The conductive feet 72 hook into the circuit board 74 and provide a constant down force at the spring fingers 70 contacting the metal shell of the connector 78.

Figure 7A:
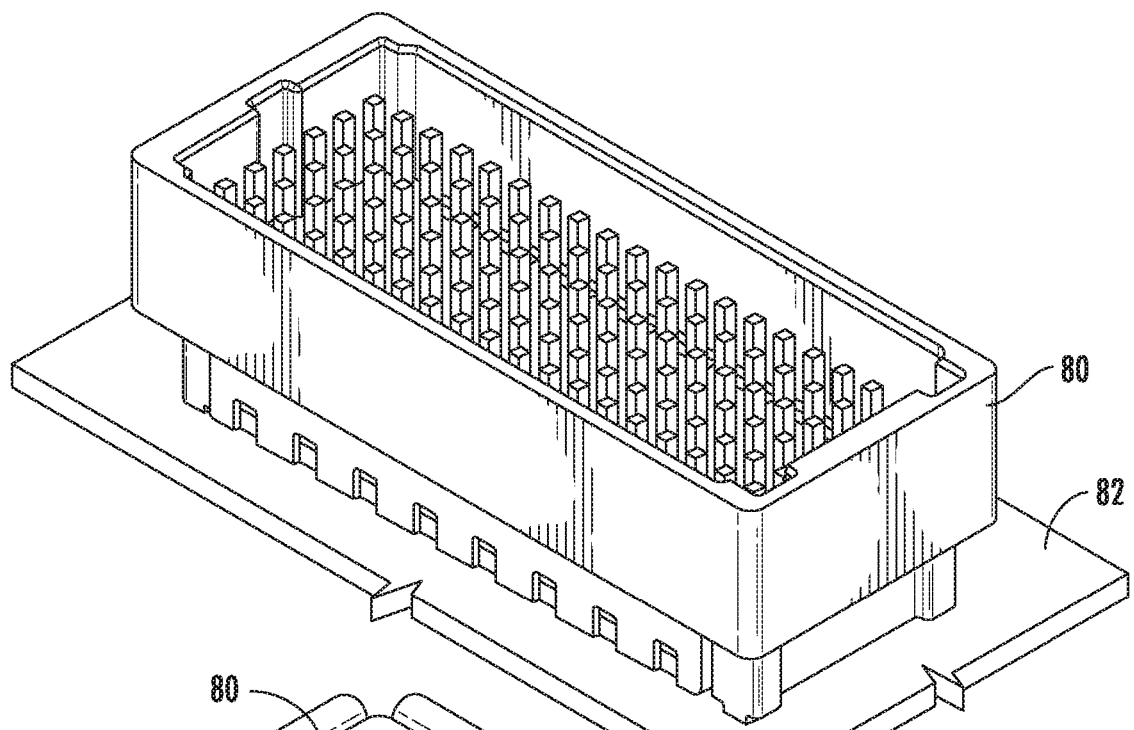
FIGS. 7A-7D illustrate perspective views of an EMI shielding system according to one embodiment.
Figure 7B:
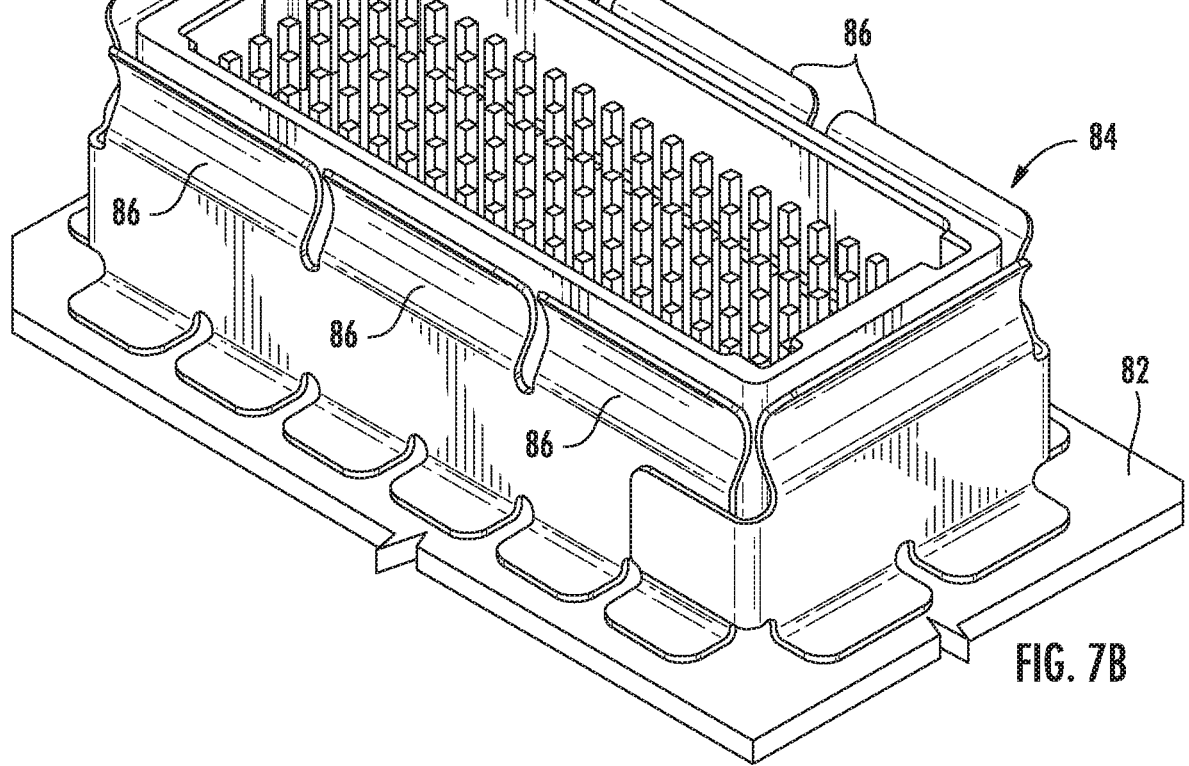
Figure 7C:
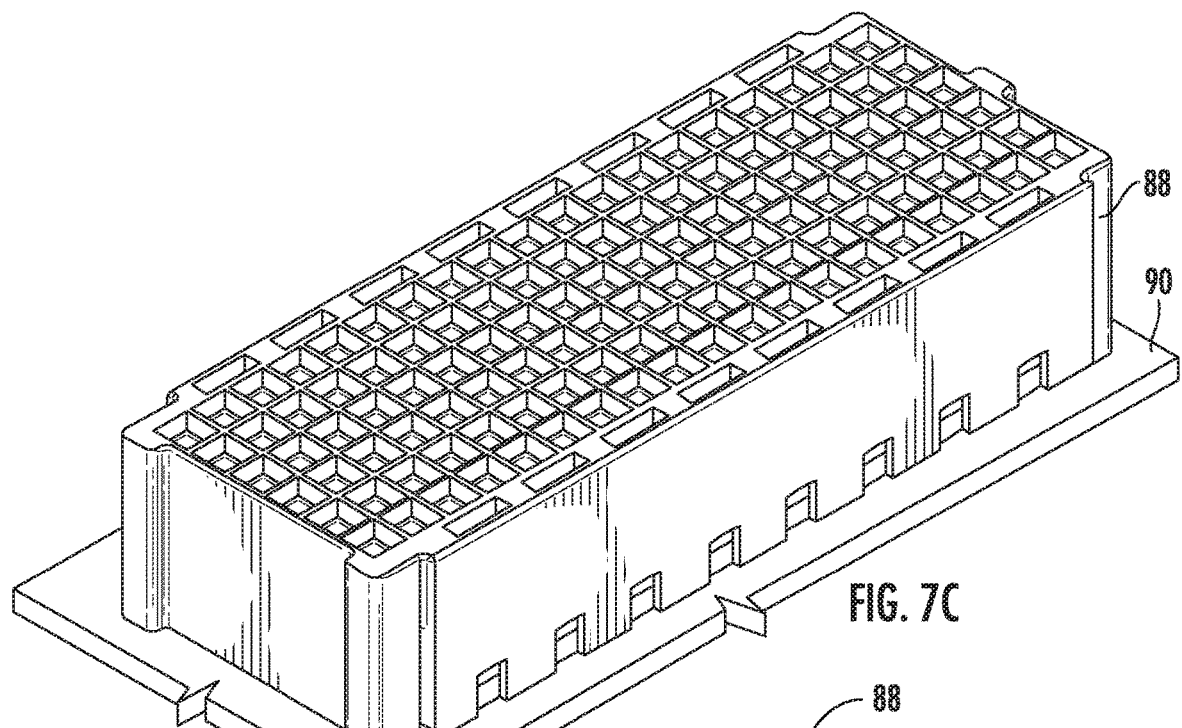
Figure 7D:
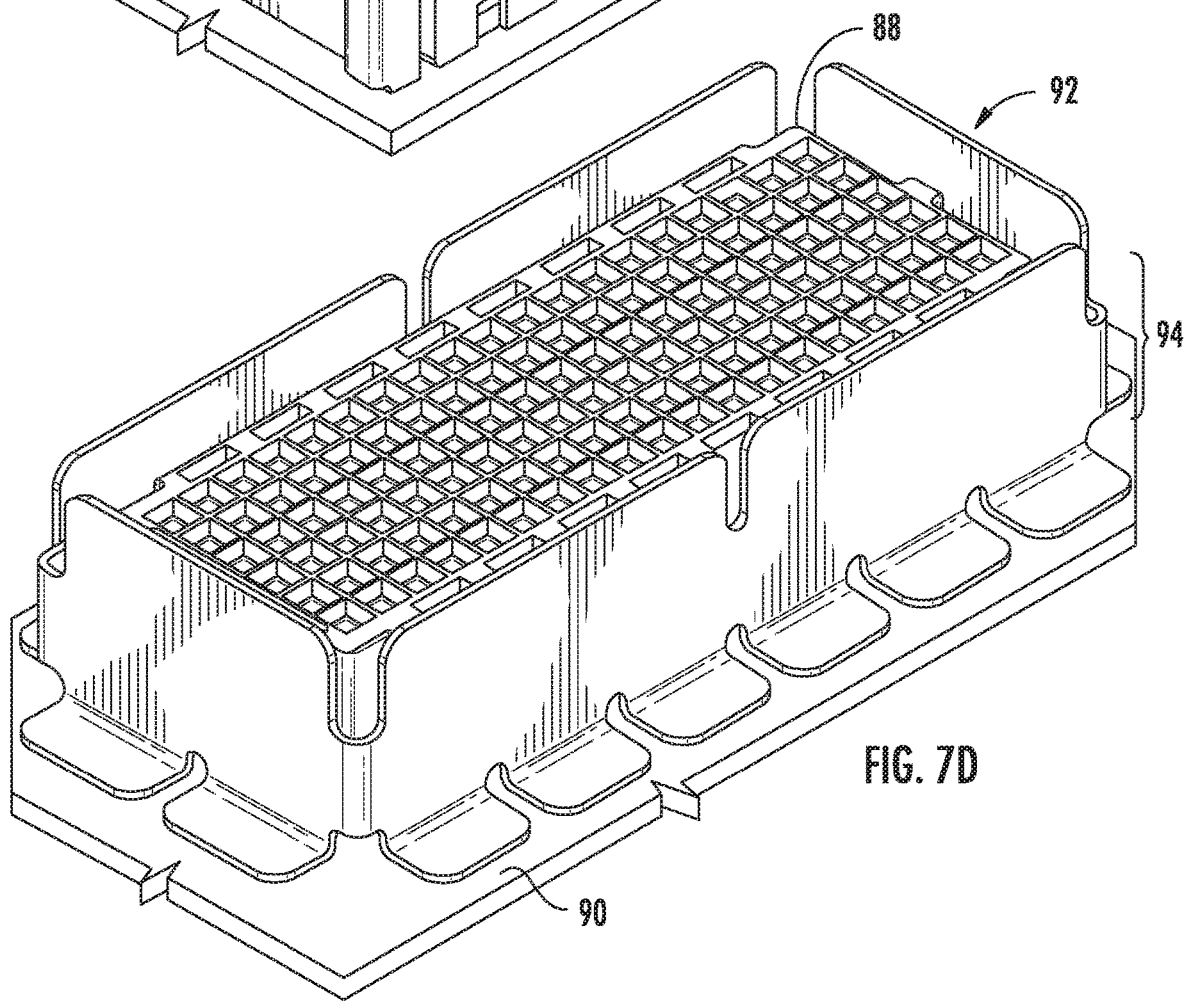

FIGS. 7A-7D illustrate perspective views of an EMI shielding system according to one embodiment. FIG. 7A is a diagram illustrating a male connector 80 coupled to a circuit board 82. FIG. 7B illustrates an electrically-conductive outer shield 84 positioned over the male connector 80 and attached to the circuit board 82. The outer shield 84 is substantially similar to the EMI shield 18 discussed above, except that spring fingers 86 may not contact the male connector 80. FIG. 7C is a diagram illustrating a female connector 88 coupled to a circuit board 90. FIG. 7D illustrates an electrically-conductive inner shield 92 positioned over the female connector 88 and attached to the circuit board 90. The inner shield 92 is substantially similar to the EMI shield 18 discussed above, except that a body 94 of the inner shield 92 is relatively planar, and may not contact the female connector 88. Collectively, the inner shield 92 and the outer shield 84, when coupled together, create a conductive perimeter around the mated pair of connectors 80, 88.

FIG. 8 illustrates a cross-section of a portion of the male connector 80, the outer shield 84, the female connector 88, and the inner shield 92, after the male connector 80 and the female connector 88 have been connected to one another. Note that the outer shield 84 comprises a restriction 96 in the way of the spring fingers 86 that are configured to contact the inner shield 92 about a perimeter of the inner shield 92. In particular, the plurality of spring fingers 86 are biased inwardly toward, and form an inner perimeter that is smaller than, an outer perimeter of the inner shield 92 prior to insertion of the inner shield 92 within the outer shield 84.

Thus, when the male connector 80 and the female connector 88 are mated, the outer shield 84 and the inner shield 92 are configured to at least partially overlap. The outer shield 84 constricts and contacts the inner shield 92 to create a conductive shield around the mated pair of connectors 80, 88. The outer shield 84 and the inner shield 92 are electrically bonded to the circuit boards 82, 90 and thus create EMI protection for the interconnections routed through the pair of connectors 80, 88.

Figure 9:
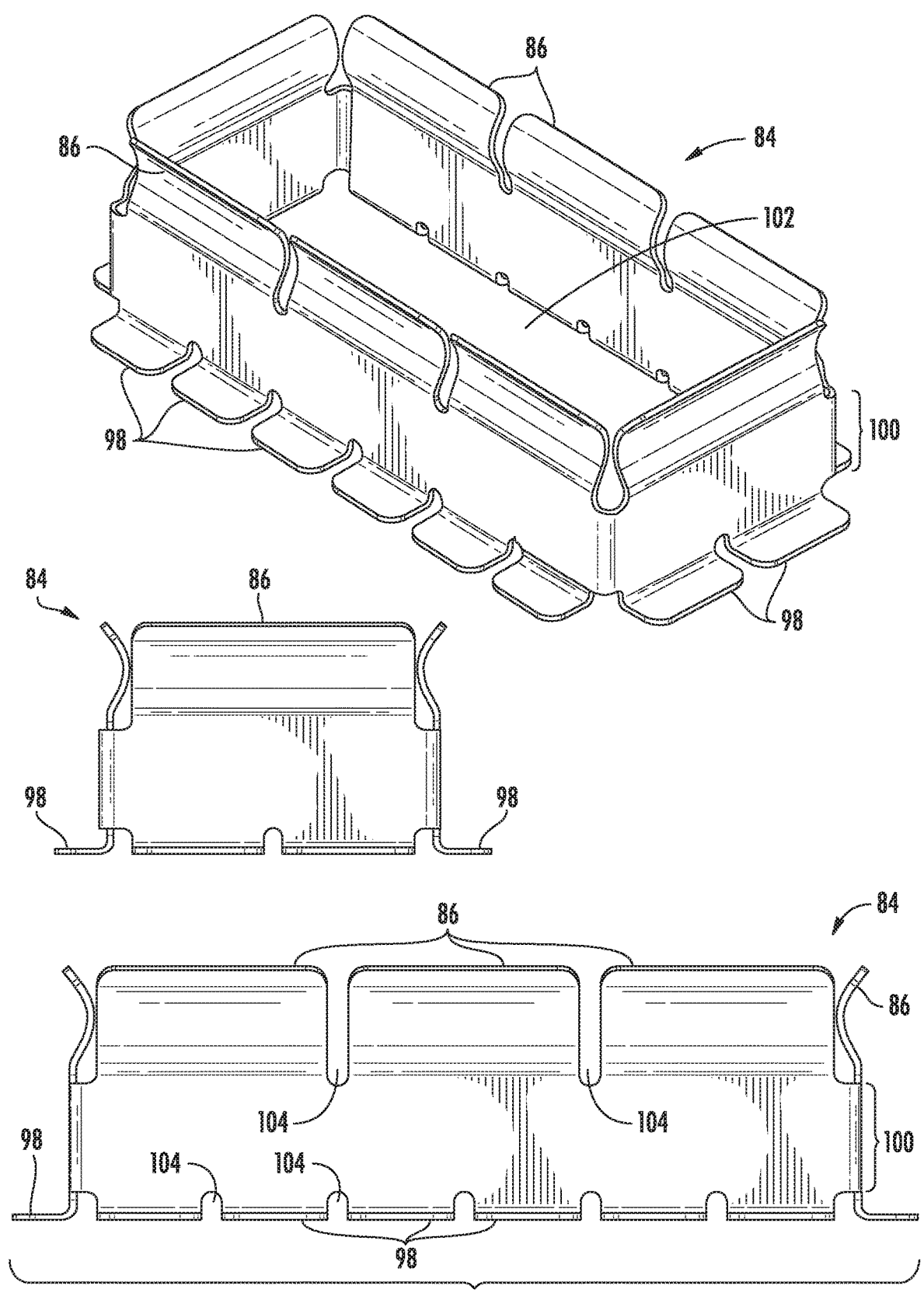
FIG. 9 illustrates three perspective views of the electrically conductive outer shield illustrated in FIGS. 7A and 7B.

FIG. 9 illustrates three perspective views of the electrically conductive outer shield 84. The outer shield 84 includes a plurality of connection members 98, in this embodiment in the form of tabs, that extend substantially perpendicularly from a body 100 of the outer shield 84 and which are configured to be electrically coupled to a ground plane of the circuit board 82 (FIG. 7B). The body 100 forms an opening 102 sized to encompass the male connector 80. The spring fingers 86 form an interior perimeter smaller than the exterior perimeter of the inner shield 92, to ensure that the spring fingers 86 make physical and electrical contact with the inner shield 92. Note that gaps 104 are sized to have a width less than a calculated fraction of the smallest wavelength within the predetermined waveband that the outer shield 84 has been designed to contain.

Figure 10:
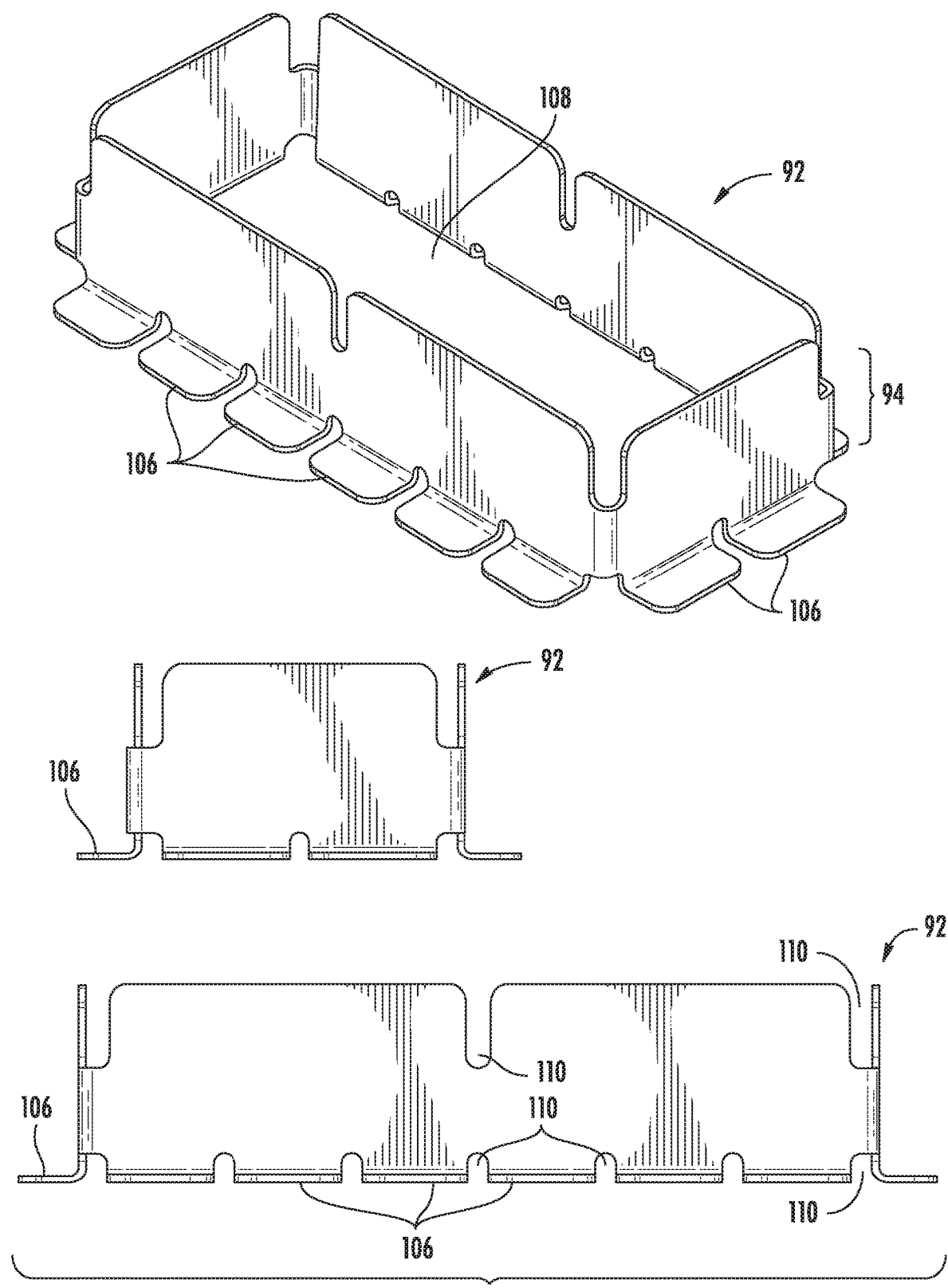
FIG. 10 illustrates three perspective views of the electrically conductive inner shield illustrated in FIGS. 7C and 7D.

FIG. 10 illustrates three perspective views of the electrically conductive inner shield 92. The inner shield 92 includes a plurality of connection members 106, in this embodiment in the form of tabs, that extend substantially perpendicularly from the body 94 of the inner shield 92 and which are configured to be electrically coupled to a ground plane of the circuit board 90 (FIG. 7D). The body 94 forms an opening 108 sized to encompass the female connector 88. In this embodiment the body 94 is substantially planar. The body 94 forms an exterior perimeter larger than the interior perimeter of the spring fingers 86 of the outer shield 84 to help ensure that the spring fingers 86 of the outer shield 84 make physical and electrical contact with the body 94 of the inner shield 92. Note that gaps 110 are sized to have a width less than a calculated fraction of the smallest wavelength within a predetermined waveband that the inner shield 92 has been designed to contain.

FIG. 11 illustrates a perspective view of an inner shield 92-1 and an outer shield 84-1 according to another embodiment. The inner shield 92-1 and the outer shield 84-1 are substantially similar to the inner shield 92 and the outer shield 84 discussed above, except as otherwise discussed below. In this embodiment, the inner shield 92-1 comprises a plurality of pins 112 that extend from a bottom of the body 94 and are configured to be inserted into corresponding plated through holes of a circuit board. The pins 112 may then be attached to the circuit board and electrically coupled to the ground plane of the circuit board. Similarly, the outer shield 84-1 comprises a plurality of plurality of pins 114 that extend from a bottom of the body 100 and are configured to be inserted into corresponding through holes of a circuit board. The pins 114 may then be attached to the circuit board and electrically coupled to the ground plane of the circuit board.

Those skilled in the art will recognize improvements and modifications to the preferred embodiments of the disclosure. All such improvements and modifications are considered within the scope of the concepts disclosed herein and the claims that follow.

What is claimed is:

1. An electromagnetic interference (EMI) shield comprising:
  an electrically conductive sleeve configured to at least partially surround a connector, the electrically conductive sleeve comprising:
    a restriction configured to contact a metal perimeter of the connector; and
    a connection member configured to be electrically coupled to a circuit board, the connection member comprising a plurality of tabs forming a plurality of gaps therebetween, a width of each of the plurality of tabs greater than a width of each of the plurality of gaps;
  wherein the EMI shield is configured to prevent radiation of a predetermined waveband from the connector into an environment; and
  wherein the plurality of tabs are configured to be electrically connected to the circuit board, the plurality of tabs forming a plurality of first gaps having a width less than a smallest wavelength of the predetermined waveband.

2. An electromagnetic interference (EMI) shield comprising:
  an electrically conductive sleeve configured to install over and at least partially surround a circuit board mounted connector on a circuit board, the electrically conductive sleeve being separate and distinct from the circuit board mounted connector, the electrically conductive sleeve comprising:
    a body portion configured to at least partially surround the circuit board mounted connector;
    a restriction configured to contact a metal perimeter of the circuit board mounted connector; and
    a connection member extending substantially perpendicularly with respect to the body portion, the connection member comprising a plurality of individual tabs configured to be electrically coupled to the circuit board;
  wherein the EMI shield is configured to prevent radiation of a predetermined waveband from the circuit board mounted connector into an environment, and wherein the electrically conductive sleeve forms a plurality of first gaps between the plurality of individual tabs, each of the plurality of first gaps having a width less than a smallest wavelength of the predetermined waveband.

3. The EMI shield of claim 2 wherein the electrically conductive sleeve forms an opening that is configured to receive the circuit board mounted connector, and wherein the restriction comprises a plurality of spring fingers, the plurality of spring fingers biased inwardly toward the opening and forming an inner perimeter that is smaller than an outer perimeter of the circuit board mounted connector.

4. The EMI shield of claim 2 wherein the electrically conductive sleeve forms an opening that is configured to receive the circuit board mounted connector, and wherein the restriction comprises a plurality of spring fingers, the plurality of spring fingers biased inwardly toward the opening and forming an inner perimeter that is smaller than an outer perimeter of the circuit board mounted connector, the spring fingers forming a plurality of second gaps therebetween, a largest width of any second gap of the plurality of second gaps being less than the smallest wavelength of the predetermined waveband.

5. The EMI shield of claim 2 wherein the connection member comprises a plurality of pins that extend from a bottom of the body portion in a same plane as the body portion.

6. The EMI shield of claim 2 wherein the electrically conductive sleeve has four walls, two end walls of the four walls extending in end wall planes that are parallel to one another, and two side walls of the four walls extending in side wall planes that are parallel to one another and that are substantially perpendicular to the end wall planes.

7. The EMI shield of claim 2 wherein the electrically conductive sleeve has four walls, two end walls of the four walls extending in planes that are parallel to one another, a back wall that is substantially perpendicular to the two end walls, and a top wall that is substantially perpendicular to the two end walls and the back wall, and is connected to the two end walls and the back wall.

8. The EMI shield of claim 2, wherein the electrically conductive sleeve is configured to augment shielding of the circuit board mounted connector.

9. The EMI shield of claim 2, wherein the electrically conductive sleeve is configured to augment metallic shielding of the circuit board mounted connector.

10. An electromagnetic interference (EMI) shielding system comprising:
  a first shield and a second shield;
  the first shield comprising a first electrically conductive sleeve configured to install over and at least partially surround a first connector on a first circuit board; and
  the second shield comprising a second electrically conductive sleeve configured to install over and at least partially surround a second connector on a second circuit board, the second connector being configured to connect to the first connector;
  wherein one of the first shield and the second shield comprises an inner shield and another of the first shield and the second shield comprises an outer shield, and wherein the inner shield is configured to be at least partially inserted within the outer shield and to contact the outer shield;
  wherein the first shield is configured to prevent radiation of a predetermined waveband from the first connector into an environment; and
  wherein the first electrically conductive sleeve comprises a first connection member comprising a plurality of individual tabs configured to be electrically connected to the first circuit board, the plurality of individual tabs forming a plurality of first gaps having a width less than a smallest wavelength of the predetermined waveband.

11. The EMI shielding system of claim 10, wherein a width of each of the plurality of tabs is greater than a width of each of the plurality of gaps.

12. The EMI shielding system of claim 10 wherein the outer shield forms an opening that is configured to receive the first connector, and wherein the outer shield comprises a restriction configured to contact the inner shield about a perimeter of the inner shield.

13. The EMI shielding system of claim 12 wherein the restriction comprises a plurality of spring fingers, the plurality of spring fingers biased inwardly toward the opening and forming an inner perimeter that is smaller than an outer perimeter of the inner shield.

14. The EMI shielding system of claim 10 wherein the first electrically conductive sleeve comprises a body portion that at least partially surrounds the first connector, and wherein the first electrically conductive sleeve further comprises a first connection member that extends substantially perpendicularly with respect to the body portion.

15. The EMI shielding system of claim 14 wherein the first connection member comprises a plurality of individual tabs configured to be electrically connected to the first circuit board.

16. The EMI shielding system of claim 10 wherein the second shield further comprises a second connection member configured to be coupled to the second circuit board, and wherein the second electrically conductive sleeve comprises a body portion that at least partially surrounds the second connector, and wherein the second connection member extends substantially perpendicularly with respect to the body portion.

17. The EMI shielding system of claim 16 wherein the second connection member comprises a plurality of individual tabs configured to be electrically connected to the second circuit board.

* * * * *